United States Patent [19]

Chung et al.

[11] Patent Number: 4,575,679
[45] Date of Patent: Mar. 11, 1986

[54] AUTOMATIC LOAD SHED CONTROL FOR SPACECRAFT POWER SYSTEM

[75] Inventors: Albert S. Chung, Wayne; Carl F. Mazzocco, Norristown, both of Pa.

[73] Assignee: General Electric Co., Philadelphia, Pa.

[21] Appl. No.: 493,227

[22] Filed: May 10, 1983

[51] Int. Cl.$^4$ .............................................. G01N 27/46
[52] U.S. Cl. .................................... 324/427; 307/39; 320/40; 320/48; 323/906
[58] Field of Search ............................... 324/426–429, 324/433, 434; 320/13, 14, 39, 40, 43, 44, 48; 340/636; 330/279; 307/38, 39; 323/906

[56] References Cited

U.S. PATENT DOCUMENTS

| | | | |
|---|---|---|---|
| 3,600,599 | 8/1971 | Wright et al. | 323/906 |
| 3,617,850 | 11/1971 | Domshy | 320/44 |
| 3,740,636 | 6/1973 | Hogrefe et al. | 320/2 |
| 3,971,980 | 7/1976 | Jungfer et al. | 324/427 |
| 4,194,146 | 3/1980 | Patry et al. | 320/44 |
| 4,247,812 | 1/1981 | Patry et al. | 320/44 |
| 4,281,278 | 7/1981 | Bilsky et al. | 323/906 |
| 4,307,330 | 12/1981 | Belot | 320/44 |
| 4,376,267 | 3/1983 | Chu et al. | 330/278 |
| 4,383,211 | 5/1983 | Staler | 320/39 |

OTHER PUBLICATIONS

Hayden, "An Electrical Power System for the Defense Satellite Communications System—Phase III", Proceedings of the 13th Intersociety Energy Conversion Conference, Aug. 1978.

Kichak, "Standard Power Regulator for the Multi-Mission Modular Spacecraft", American Chemical Society, 1979.

Primary Examiner—Ernest F. Karlsen
Assistant Examiner—Kevin D. O'Shea
Attorney, Agent, or Firm—Allen E. Amgott

[57] ABSTRACT

An automatic load shed control for a spacecraft power system employs a selectable one of a plurality of charging gains to approximate a state of charge in a secondary battery system. An ampere hour meter is initialized when the battery system is known to be fully charged and the inefficiencies of the charging system are lumped into a charging gain parameter. An output of the ampere hour meter is compared with a load shed threshold to determine the time for load shedding. The charging gain can be remotely changed as required to a value which causes the output of the ampere hour meter to track the true state of charge of the battery system closely enough for system satisfactory operation of load shedding. The charging gain may be a constant or may be a variable in dependence on the state of charge of the battery system. Charge which is delivered at a rate below a predetermined threshold is ignored by the ampere hour meter.

24 Claims, 6 Drawing Figures

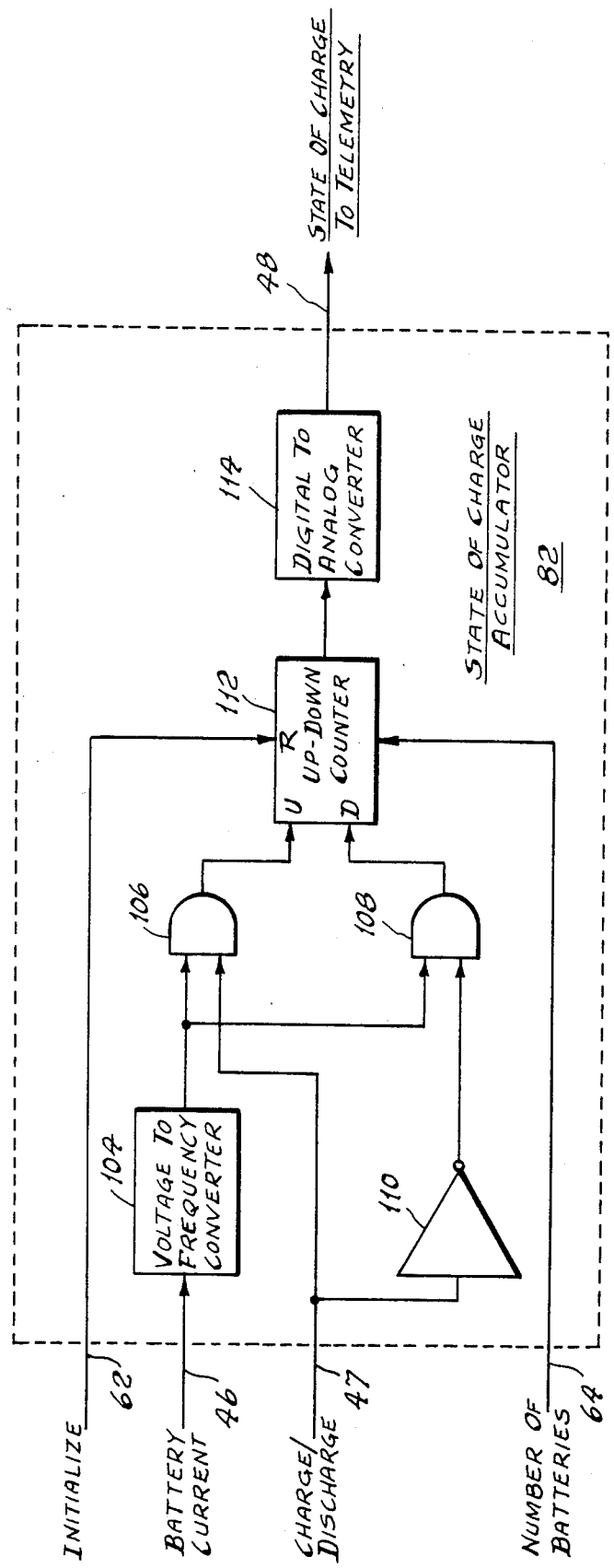

AUTOMATIC LOAD SHED CONTROL FOR SPACECRAFT POWER SYSTEM

The Government has rights in this invention pursuant to Contract No. F04701-77-C-0036 awarded by U.S. Air Force.

BACKGROUND OF THE INVENTION

The present invention relates to electrical power supply systems and, more particularly, to load shedding apparatus for battery storage power supplies.

Some power supply systems which include battery power storage may experience load demands which periodically exceed the energy capacity of the system. Such systems include spacecraft systems in which a battery storage system is charged by a solar array.

The problem becomes especially troublesome in spacecraft in orbits where substantial eclipse periods may cut off the solar array from insolation. If the load being supplied by the battery system becomes high during an eclipse period, the energy remaining in the battery system may be reduced to a value below that at which activities necessary to the survival of the spacecraft may be performed. For example, it is vitally necessary that the spacecraft maintain attitude control since loss of attitude control may permit the spacecraft to begin tumbling. This could be fatal since it may prevent the solar array from again acquiring sufficient energy to restore the battery charge during the ensuing period of access to solar energy. Thus the loss of function could be permanent.

In order to avoid potentially fatal drainage of spacecraft storage batteries, it has become conventional to divide the spacecraft electrical load into an interruptible load and an uninterruptible load. In a communications satellite, for example, attitude control and certain necessary housekeeping activities may be defined as the uninterruptible load which must remain supplied with the remaining power in the battery system regardless of the actual amount remaining. The communications task of the satellite may be defined as the interruptible load since, although lack of communications for a period may be inconvenient, the alternative of complete and permanent loss of spacecraft utility is generally considered too high a price to pay for a limited period of continued communications.

Ideally, the interruptible load is shed when the battery system contains an amount of charge remaining that is sufficient to enable the spacecraft system to survive until a positive battery charging condition is achieved. That is, load shedding should be performed when the battery system has reached a predetermined state of charge. This permits continuing the spacecraft mission (e.g. communications) for as long as possible without jeopardizing the survival of the system.

The state of charge of some battery systems can be determined or inferred from measurements. For example, the state of charge of a lead-acid battery can be determined from a measurement of the specific gravity of its electrolyte. Unfortunately, the state of charge of nickel-cadmium batteries, which are favored in spacecraft applications, cannot be explicitly determined from internal measurements or from terminal conditions. The terminal voltage, for example is a non-linear function of charge which is dependent on a complex function of temperature, battery age, battery usage history and battery state of charge. Particularly near the fully charged state, the amount of charge added to a nickel-cadmium battery per ampere hour fed to it decreases rapidly and non-linearly. Also, near the fully charged state, the terminal voltage rises rapidly to a maximum value.

Due to the uncertainty of battery state of charge, prior art load shedding systems depend principally on simple timing strategies to select a time for load shedding. This, of course, risks errors of two types. The most serious error is that of delaying load shedding beyond the time at which sufficient charge remains to sustain vital functions until a positive charging rate is again achieved. The less serious error is unnecessarily interrupting the spacecraft mission when more than sufficient charge remains to survive the anticipated charging deficiency period.

OBJECTS AND SUMMARY OF THE INVENTION

Accordingly, it is an object of the invention to provide an automatic load shed control for a spacecraft power system which avoids the drawbacks of the prior art.

It is a further object of the invention to provide an automatic load shed control or a spacecraft power system which employs a measurement of the power added to, and removed from, a battery system starting from an initial fully charged condition to determine a time for load shedding.

It is a further object of the invention to provide an automatic load shed control for a spacecraft power system which employs a selectable charge/discharge efficiency ratio to infer a state of charge based on power added to, and removed from, a battery system starting from an initial fully charged condition to determine a time for load shedding.

It is a further object of the invention to obtain a system-satisfactory solution for determining a time for load shedding by lumping all of the battery and charging system non-linearities into a selectable charge/discharge efficiency ratio to infer the state of charge of a battery system beginning from an initial fully charged condition.

According to an embodiment of the invention, there is provided apparatus for calculating a state of charge of batteries in a battery system of the type having at least one of a variable source capacity and a variable load, comprising means for measuring a charging current and a discharging current of the batteries, means having a first gain for accumulating a first value related to the charging current, means having a second gain for calculating a second value related to the discharging current, means for differencing the first and second values to produce a calculated state of charge of the battery system, means for initializing the means for differencing to a known value of the state of charge of the battery system, and means for selecting a value of at least one of the first and second gains effective to produce an output of the means for differencing which is an approximation of a variable state of charge of the battery system.

According to a feature of the invention, there is provided a method for calculating a state of charge of batteries in a battery system of the type having at least one of a variable source capacity and a variable load, comprising measuring a charging current and a discharging current of the batteries, calculating a first value related to the charging current at a first gain, calculating a second value related to the discharging current at a second gain, differencing the first and second values to produce a calculated state of charge of the battery system, initializing the differencing to a known value of the state of charge of the battery system, and selecting a value of at least one of the first and second gains effective to produce an output of the differencing which is an approximation of a variable state of charge of the battery system.

According to a further feature of the invention, there is provided an automatic load shedding apparatus for a battery power system of the type having at least one battery and at least one of a variable source capacity and a variable load, the load including an interruptible load and an uninterruptible load, comprising means for producing a first signal at a first gain responsive to a charging current in the battery, means for producing a second signal at a second gain responsive to a discharge current in the battery, means for differencing the first and second signal to produce a state of charge signal, means for initializing the state of charge signal to a predetermined fixed value, means for selecting at least one of the first and second gains effective for making the state of charge signal representative of a variable state of charge of the at least one battery, means for producing a load shed reference signal, means for producing a load shed command signal in response to a predetermined relationship of the state of charge signal and the load shed reference signal, and a load shed relay responsive to the load shed command signal for shedding the interruptible load.

Briefly stated, the present invention provides a ground-controllable automatic or semi-automatic load shedding system in which one of a plurality of selectable battery charging efficiencies may be employed in an ampere hour meter to calculate an approximation of the state of discharge of a battery system beginning from an initially fully charged condition. The ampere hour meter produces an output signal which is compared to a load shed reference signal to determine a load shed point. Different load shed references are provided for different numbers of batteries and operating conditions.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 6 is a block diagram of a state of charge accumulator of FIG. 4.

DETAILED DESCRIPTION OF THE PREFERRED EMBODIMENT

Figure 1:
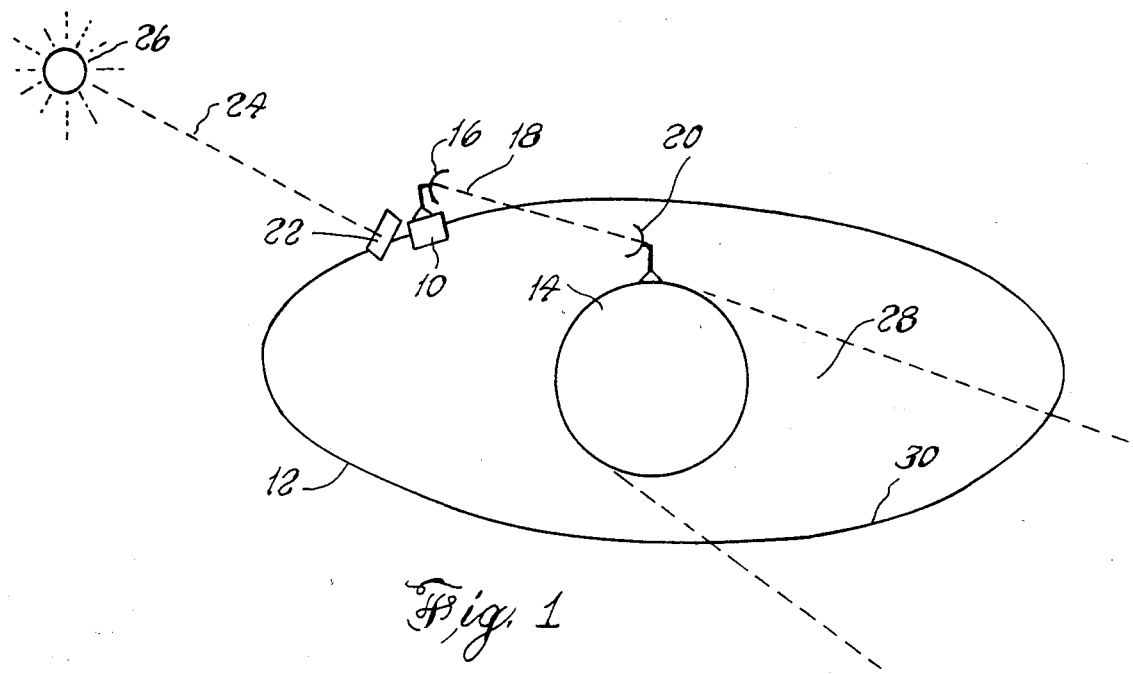
FIG. 1 is a perspective view of a spacecraft in orbit about a planetary body to which reference will be made in describing the problem to be addressed by the present invention.

Referring now to FIG. 1 there is shown, generally at 10, a spacecraft in an orbit 12 about a planetary body 14 such as, for example, the earth. It is assumed for purposes of description that spacecraft 10 is a communications satellite having a directional antenna 16 which requires pointing along a line of sight 18 to an earth station antenna 20. Power for all functions in spacecraft 10 is obtained from a solar array 22 which is preferably maintained in a plane normal to a line of sight 24 to the sun 26.

As is well known, planetary body 14 blocks solar energy from a cone 28 located on its side remote from sun 26. At certain orbital inclinations, which occur during a period twice a year, a portion 30 of orbit 12 lies within cone 28 whereby solar radiation is blocked from solar array 22. In certain earth orbits, the maximum period of eclipse during which spacecraft 10 travels along eclipsed portion of orbit 30 can endure for a period of an hour or more.

Although the power system for spacecraft 10 may be designed to survive with all functions being performed for a maximum expected eclipse period, higher than expected electrical loads, greater than expected degradation in the efficiency of solar array 22 or a more rapid than expected reduction in battery capacity may reduce stored electrical energy beyond the point of safety or survival before spacecraft 10 again comes within line of sight to sun 26. Before and after the maximum period of eclipse, the time during which solar blocking occurs is progressively reduced.

The problem of periodic eclipsing of spacecraft 10 may be aggravated by the periodic requirement to recondition one of the batteries making up a nickel-cadmium battery system. In a series nickel-cadmium battery system, a battery is reconditioned by removing it from service and reducing its stored charge to zero over a period of time before restoring it to service. This cycle may be repeated two or more times while reconditioning a battery. While one battery of a battery system is being reconditioned, the remaining batteries are required to sustain the load. If battery reconditioning is under way or if a battery has failed, the remaining batteries are called upon to deliver a greater than usual amount of power and are therefore capable of sustaining all spacecraft electrical requirements for a reduced amount of time. In addition, when a battery is taken out of service for reconditioning and/or is restored to service thereafter, calculation of the state of charge in the battery system is made more complex as will be described.

Figure 2:
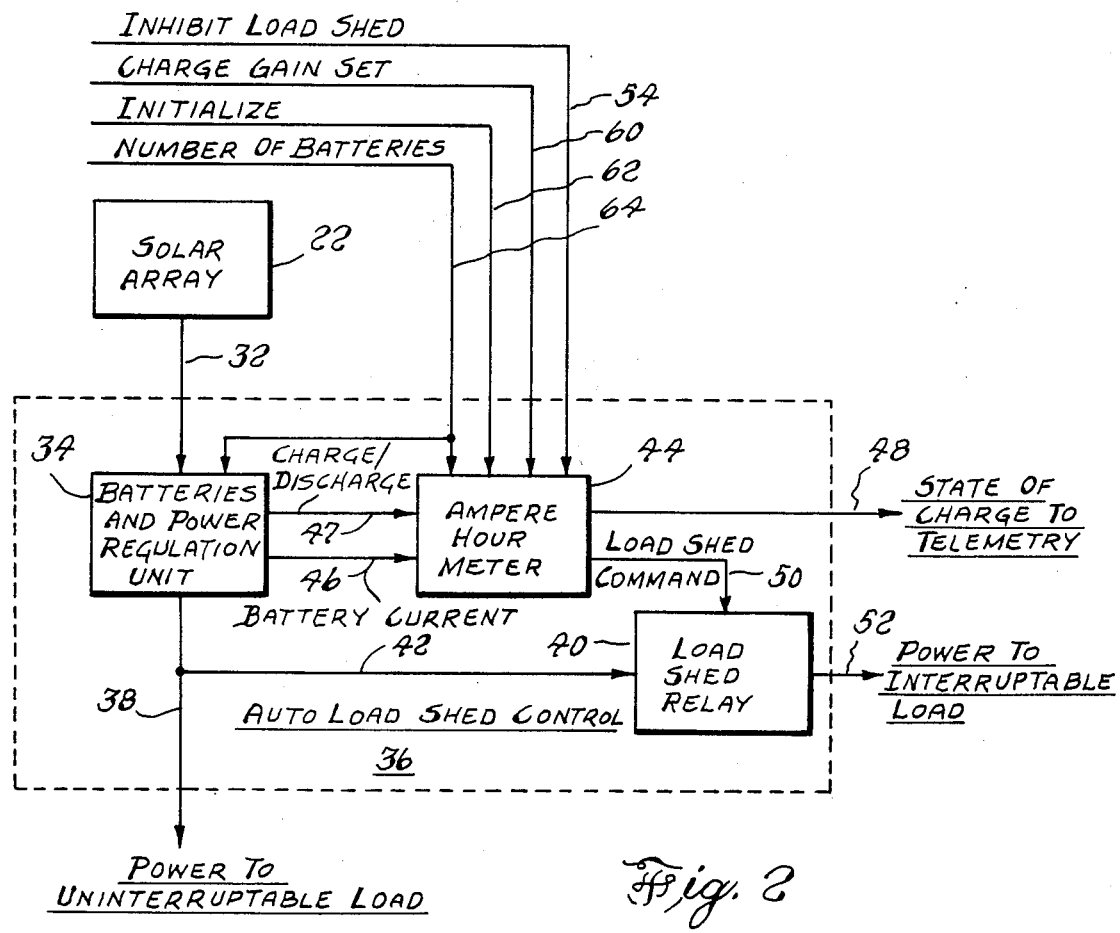
FIG. 2 is a simplified block diagram of an automatic load shed control according to an embodiment of the invention.

Referring now to FIG. 2, solar array 22 is seen to feed power on a line 32 to a batteries and power regulation unit 34 in an automatic load shed control unit 36. Batteries and power regulation unit 34 contains a plurality of nickel-cadmium batteries for storing electric power received from solar array 22 as well as conventional regulating and measuring apparatus. For present purposes it is sufficient to state that batteries and power regulation unit 34 delivers stored electric power on a line 38 to an uninterruptible load (not shown) and on a line 42 to a load shed relay 40. Batteries and power regulation unit 34 provides a signal related to the current being fed to, or being taken from, the batteries on a line 46 to an ampere hour meter 44. In addition, batteries and power regulation unit 34 provides a signal on a line 47 which indicates whether the net power flow is into the batteries (net charge) or out of the batteries (net discharge).

Ampere hour meter 44 accumulates the charge and discharge currents beginning from an initial condition of fully charged batteries to maintain a running calculation of the charge delivered from the fully charged batteries. That is, ampere hour meter 44 maintains a calculation of the state of charge or discharge of batteries in batteries and power regulation unit 34. Ampere hour meter 44 provides a signal representing the state of charge or discharge of the battery system to a telemetry system (not shown) on a line 48.

Ampere hour meter 44 also compares its calculation of the state of discharge of the batteries with a threshold value and, if the state of discharge exceeds the threshold value, indicating that the charge remaining in the batteries is calculated to be too low, ampere hour meter 44 applies a load shed command on a line 50 to load shed relay 40.

In the absence of a load shed command on line 50, load shed relay 40 applies battery power delivered to it on line 42 via a line 52 to the interruptible load (not shown). When a load shed command is received on line 50, load shed relay 40 interrupts the power on line 52 to thereby place spacecraft 10 in survival mode wherein only those housekeeping functions are performed which are vital to the ability of spacecraft 10 to maintain itself in functioning condition until a positive charging condition can again be achieved.

A number of inputs are conveniently provided from an external source such as, for example, from a conventional telemetry system, to automatic load shed control unit 36. For example, it may be convenient to inhibit load shedding based on a telemetered input on a line 54 to ampere hour meter 44. This may be performed when, for example, a control location, guided by the telemetered data on the state of charge or discharge of the batteries, is able to maintain communications with spacecraft 10 during an eclipse and to override the automatic load shed function of ampere hour meter 44. Use of the automatic load shed feature may be reserved for times when the control location is unable to maintain communications with spacecraft 10.

The actual state of charge of nickel-cadmium batteries is such a highly non-linear function of many parameters, including several which change with system aging, that a truly accurate representation of the state of charge or discharge of a nickel-cadmium battery system is extremely difficult to produce from knowable parameters in a spacecraft environment. However, the inventors have discovered that a system-satisfactory solution can be achieved using a number of simplifications which collapse the uncertainties into a relatively simple index which can be adjusted from the ground according to parameters which are capable of being measured.

A nickel-cadmium battery has the characteristic that, for a given current, its terminal voltage rises rapidly to a maximum value when it becomes fully charged. Depending upon actual charging circuitry, this voltage rise or a corresponding decrease in charge current may serve as a benchmark condition which, when sensed, may be interpreted as indicative of a fully charged condition of the battery. Thus, one condition of the battery, that is, the fully charged condition, can be sensed. Another way that the fully charged state can be determined is from a knowledge of the time during which solar array 22 is exposed to sunlight. That is, in a system in which solar array 22 has an electricity production capability exceeding the normal electrical load, if solar array 22 has received sunlight for a predetermined amount of time, and if the electrical load on the batteries remains within normal operational parameters, a fully charged condition can be presumed.

Figure 3:
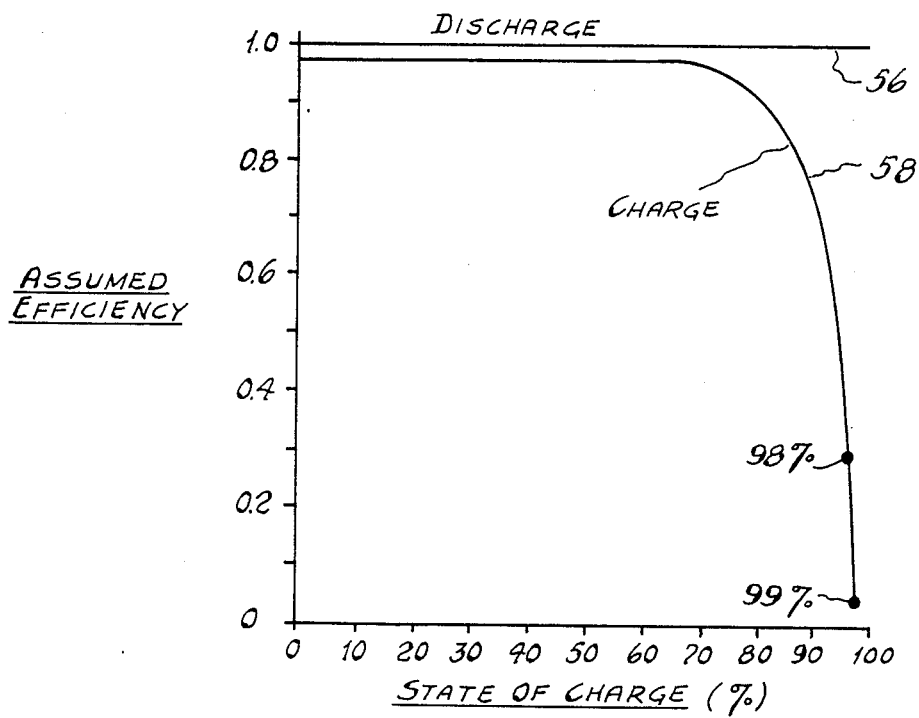
FIG. 3 is a curve to which reference will be made in describing battery charging efficiency.

As is well known, only a part of the energy stored in a secondary battery can be recovered. One way of approximating the difference between charge delivered to the batteries and charge recoverable from the batteries is to assume a difference in efficiency in the charging and discharging processes. Referring to FIG. 3, for example, a discharge efficiency, represented by a line 56, is assumed to be 1.0 for any state of charge of the batteries. Conversely, the charging efficiency, represented by a line 58 is highly non-linear, especially at values exceeding about 70 percent of charge. At low values of charge below, for example, about 70 percent, the charging efficiency may be substantially linear and as high as about 0.98. That is, in this range, as much as about 98 percent of the charge delivered to the batteries can be recovered from them. At higher values of state of charge, however, the charging efficiency falls off dramatically until it approaches zero near the fully charged state. Although the discharge efficiency is not, in fact, 1.0 in a real battery system, no damage is done to the practical implementation of a system employing this assumption since the important parameter is the ratio of charging and discharge efficiencies rather than the values themselves.

It should be noted that the efficiencies represented in FIG. 3 are good for only one point in life of a battery and the charge/discharge ratio may change, usually degrade, with time. In addition, nickel-cadmium batteries exhibit a learning phenomenon in which, when their state of charge is regularly cycled between maximum and minimum conditions well above a state of complete discharge, they experience a reduction in storage capacity. This reduction in storage capacity can be represented, at least to a first approximation, by a change in the assumed charge/discharge efficiency ratio. The reconditioning process previously mentioned tends to overcome the learning process and to thereby restore the battery to an approximation of its original capacity. This implies, of course, that the charge/discharge efficiency ratio is changed by battery reconditioning.

Returning now to FIG. 2, a charge gain set command is applied on a line 60 from the telemetry system (not shown) to ampere hour meter 44. The charge gain set command establishes the one of a family of charge/discharge ratios to be used by ampere hour meter 44 in calculating a state of charge.

An initialize command is applied from the telemetry system on a line 62 to ampere hour meter 44 at a time when the batteries are fully charged. This establishes the initial condition for calculating the state of charge or discharge of the batteries based on charge and discharge current as mediated by the assumed charge/discharge ratio.

In a system which provides for changing the number of batteries actively in the system to provide, for example, the ability to perform battery reconditioning or accommodate a battery failure, a battery command signal indicating the number of batteries to be used is applied from the telemetry system on a line 64 to ampere hour meter 44 and to batteries and power regulation unit 34. In batteries and power regulation unit 34 the battery command signal actuates conventional switching apparatus to connect one or more batteries into, or to remove them from, active use in storing and delivering power. In ampere hour meter 44, the battery command signal initializes the calculating circuits to perform the required calculations on the basis of the number of batteries being used and also resets the load shed threshold to accommodate the changed battery capacity.

Without any intention of limiting the scope of the invention to any particular number of batteries or a particular arrangement for changing their use, a battery system employing three nickel-cadmium secondary batteries is assumed for concreteness of description. Each of the batteries is assumed to have a nominal worst-case capacity of 32 ampere hours, for a total capacity of 96 ampere hours. At most, one of the three batteries is assumed to fail or may be undergoing reconditioning at any one time. Thus, a minimum total assumed capacity of 64 ampere hours is provided when the two active batteries are fully charged.

Reconditioning is begun only when all three batteries are fully charged. Reconditioning is begun by the application of a two-battery signal on line 64 and by an initialize command on line 62. The two-battery signal, which may be, for example, a bi-state signal, causes one of the three batteries to be switched out of active use in batteries and power regulation unit 34. The combination of the two-battery signal and the initialize command causes ampere hour meter 44 to start calculating from a fully charged condition and to change the load-shed and charge thresholds to accommodate the reduced battery capacity. When a reconditioned battery is returned to service, a second initialization command at this time is effective to restore the load shed threshold to the normal value for three batteries.

Figure 4:
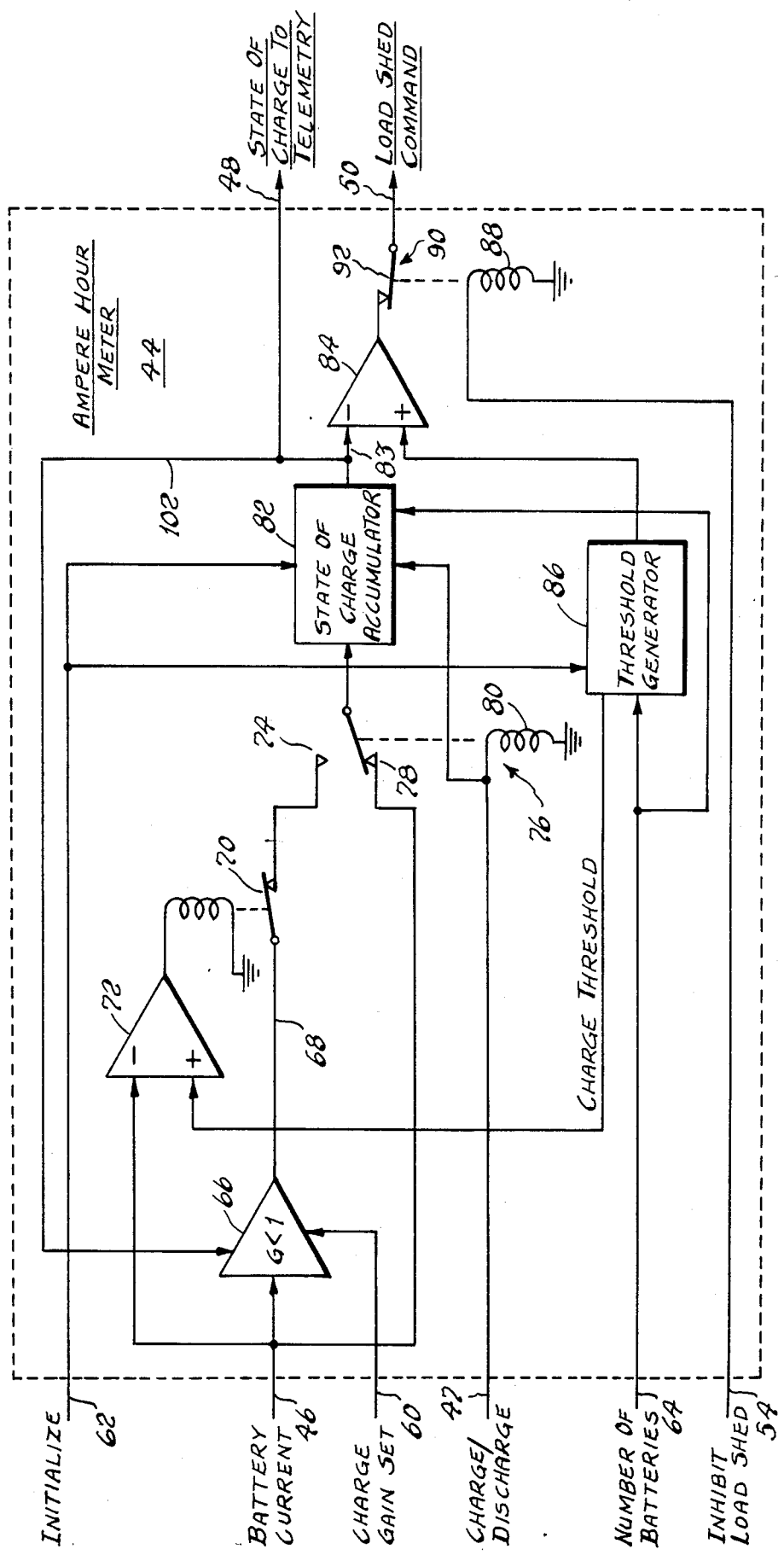
FIG. 4 is a block diagram of an ampere hour meter of FIG. 2.

Referring now to FIG. 4, one embodiment of ampere hour meter 44 is shown having a controllable-gain amplifier 66 receiving the battery current signal from line 46 at one of its inputs and having its gain controlled by the charge gain set command from line 60 at its other input. As indicated in the figure, the gain G of controllable-gain amplifier 66 is controlled to a value less then 1. The output of controllable-gain amplifier 66 is applied on a line 68 to contacts of a relay 70. An actuating coil of relay 70 receives the output of a comparator 72.

The signal from relay 70 is applied to a fixed terminal 74 of a relay 76. The battery current signal on line 46 is connected directly to a second fixed terminal 78 of relay 76. The charge/discharge signal on line 47, which is indicative of whether the battery current signal represents charge or discharge, is applied to an actuating coil 80 of relay 76. Whenever a net discharge of battery power is occurring, the charge/discharge signal on line 47 is effective to actuate relay 76 into the position shown wherein the movable contact thereof is placed in contact with fixed terminal 78. Since fixed terminal 78 is directly connected to the battery current signal on line 46, the gain of this path is 1. Whenever a net charge is occurring, the charge/discharge signal on line 47 is effective to place the movable contact of relay 76 in contact with fixed terminal 74. Since, as noted, the gain of controllable-gain amplifier 66 is always less than 1, a charging signal on this path has a reduced effect on succeeding circuits.

The signal from the movable contact of relay 76 is applied to one input of a state of charge accumulator 82. The initialize command on line 62 is applied to a second input of state of charge accumulator 82. The charge/discharge signal on line 47 is applied to a third input of state of charge accumulator 82.

Beginning when it receives an initialize command indicating an initial condition of full charge, state of charge accumulator accumulates positive charge at a fraction of the rate of actual delivery of charge to the battery system as determined by the charge gain set signal applied to controllable gain amplifier 66 and subtracts 100 percent of the charge removed from the battery system during periods of net discharge.

State of charge accumulator 82 produces an output signal related to its calculation of the amount of charge removed from the battery system which is applied on a line 83 to the negative input of a load shed comparator 84 and on line 48 to the telemetry system (not shown). The number of batteries signal on line 64 is applied to an input of a threshold generator 86. Threshold generator 86 is effective to generate a load shed threshold signal voltage which depends on the number of batteries currently in active status in the battery system. If state of charge accumulator 82 produces an analog voltage in the range of, for example, zero volts representing zero charge to five volts representing full charge, then with three 32-ampere-hour batteries on line in the system, five volts represents 96 ampere hours. If the load-shed point while using three batteries is selected to actuate when 75 percent of the original charge is depleted, a threshold voltage of 1.25 volts is produced by threshold generator 86.

When using two batteries, slightly more depth of depletion may be permitted such as, for example, 85 percent of full charge. If state of charge accumulator 82 is initialized to five volts, which may still represent a potential capacity of 96 ampere hours, when initialized by a two-battery command, threshold generator 86 produces a load shed threshold voltage signal of 2.167 volts. This load shed threshold voltage is reached when a charge of 54.4 ampere hours ($64 \times 0.85$) has been depleted from the battery system.

The generation of a load shed threshold voltage signal after returning to three-battery operation from two-battery operation following battery reconditioning is the same as the two-battery operation described in the preceding since the charge in two fully charged batteries (64 ampere hours) is shared equally between three batteries. If the battery being returned to service is also fully charged, application of a normal initialize command on line 62 is effective to return the load shed threshold signal voltage to the three-battery value of 1.25 volts.

One skilled in the art would recognize that the illustrative values for voltages and the sequence of use could be modified in the light of the foregoing disclosure without departing from the scope of the present invention.

The inhibit load shed signal on line 54 is applied to a coil 88 of a load shed inhibit relay 90. Contacts 92 of load shed inhibit relay 90 are in series between the output of load shed comparator 84 and load shed command line 50. Thus, when load shed inhibit relay 90 is energized, load shed command line 50 is prevented from receiving a load shed command.

Figure 5:
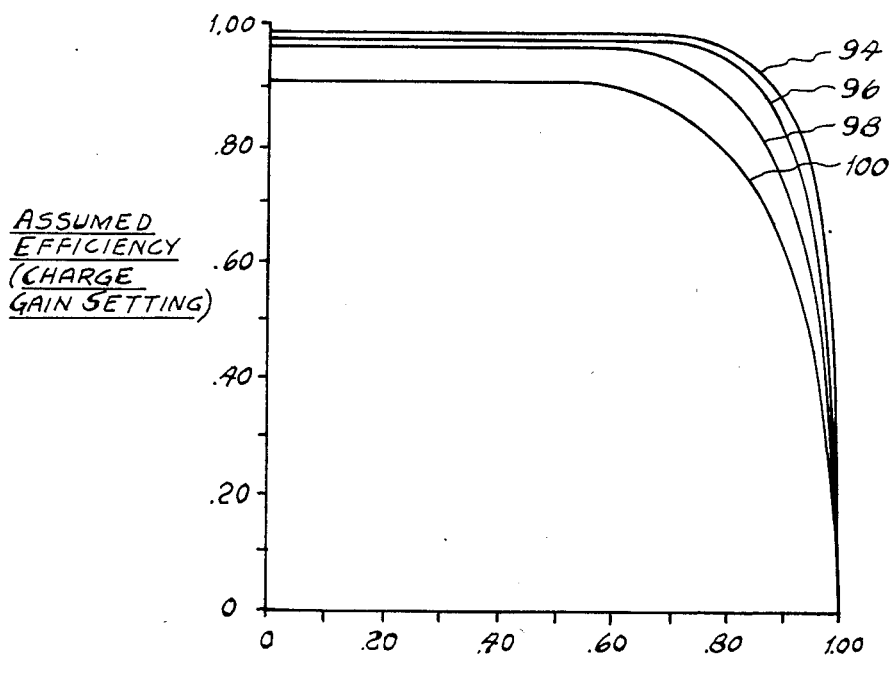
FIG. 5 is a family of charging efficiency curves.

By appropriately selecting the gain setting of controllable-gain amplifier 66 according to the expected charge-discharge program, load, solar array condition and battery age, a system-satisfactory solution to automatic or semi-autonomous control of load shedding can be achieved. The gain of controllable-gain amplifier 66 can be controlled in a number of alternative ways to achieve satisfactory operation of the load shedding system. One technique is illustrated in FIG. 5. Assuming constant battery temperature, as a nickel-cadmium battery ages, its charging efficiency decreases. Thus, the charging efficiency over the life of the battery system may be represented by a family of curves. An upper curve 94 represents the charging efficiency of a new battery system. Lower curves 96, 98 and 100 represent the charging efficiencies of progressively older battery systems. Thus, the charge gain set command on line 60 may select one of charging efficiency values shown in curves 94–100 which may be stored as a selected gain value in controllable-gain amplifier 66 or may be supplied as data on charge gain set command line 60. For a given amount of charge in the battery system, as determined from an output of state of charge accumulator 82 fed back on a line 102, the gain of controllable-gain amplifier 66 is adjusted to produce an output which varies in the same fashion as the assumed efficiency of the selected curve of FIG. 5. For convenience, the smooth curves of FIG. 5 may be approximated by a piecewise linear approximation. It is well known that the greater the number of linear regions used in a piecewise linear approximation, the more accurate the representation of the original smooth curve. In one embodiment of the invention, 11 linear regions, requiring 12 data points, are employed to represent each curve.

The selection of the one of charging efficiency curves to be used at any time may be done according to simulation and/or empirical results. For example, an initial charging efficiency curve may be selected prior to launch of spacecraft 10 based on ground testing and simulation employing a priori data on the mission, electrical supply and load and the ephemeris. After launch, the actual charging performance may be monitored during periods of spacecraft telemetry coverage to determine how closely it tracks predicted performance. In making this determination, the following parameters are of value:

the time at which full charge is attained;
the length of an eclipse period;
the current used in an eclipse period;
the current used to return to full charge.

Assuming that an eclipse period begins when all batteries are fully charged, the actual ampere-hours depletion at the end of the eclipse period is known from the current drawn during the eclipse period. Since the actual ampere-hours required to return the battery system to full charge is obtainable, the correctness of choice of charging efficiency curves 94–100 can be verified and, if the result is outside satisfactory boundaries, a different curve more closely representing experience can be employed.

Certain mission profiles permit further simplification of ampere hour meter 44. For example, instead of changing the gain of controllable-gain amplifier 66 as a function of the calculated state of charge as indicated in the preceding paragraphs, the gain of controllable-gain amplifier 66 may be held constant at a selectable value of gain irrespective of the state of charge calculated by state of charge accumulator 82. Although the calculated state of charge may develop errors, the hardware simplification permitted by the fixed-gain approach may make this approach desirable and, in fact, this represents the preferred embodiment.

Although the exact values for gain used in controllable-gain amplifier 66 may vary from application to application, in the preferred embodiment, the gain is controlled by a three-bit binary number to one of eight values as follows:

| BINARY NUMBER | GAIN |
| --- | --- |
| 000 | 0.910 |
| 001 | 0.865 |
| 010 | 0.823 |
| 011 | 0.785 |
| 100 | 0.751 |
| 101 | 0.719 |
| 110 | 0.690 |
| 111 | 0.664 |

One of the above three-bit binary numbers is selected prior to launch as best representing the overall charging efficiency of the new battery system under predicted mission profiles. Later when battery aging or other causes make the gain value chosen an inadequate approximation of system performance, a different value may be supplied under telemetry control from the ground.

One embodiment of state of charge accumulator 82 is shown in FIG. 6. The battery current signal from relay 76 (FIG. 4), either directly from line 46 during discharge or from controllable-gain amplifier 66 during charge, is applied to an input of a voltage-to-frequency converter 104. Voltage-to-frequency converter 104 produces an output frequency which is proportional to its input voltage. The output of voltage-to-frequency converter 104 is applied to one input of AND gates 106 and 108. The charge/discharge signal is applied to a second input of AND gate 106. The charge/discharge signal is also applied to the input of an inverter 110 whose output is connected to a second input of AND gate 108. The output of AND gate 106 is connected to an up input U of an up-down counter 112. The output of AND gate 108 is connected to a down input D of up-down counter 112. The initialize command on line 62 is applied to a reset input R of up-down counter 112. The number stored in up-down counter 112 is applied to a digital-to-analog converter 114.

Digital-to-analog converter 114 may have a range of from zero to five volts over the range of values storable in up-down counter 112. When up-down counter 112 is reset by the initialize command on line 62, its output enables digital-to-analog converter 114 to produce a five-volt analog signal which may be converted for telemetry to the ground. As the count in up-down counter 112 is decreased and increased, the output of digital-to-analog converter 114 is correspondingly decreased and increased.

Up-down counter 112 may be, for example, an eight bit binary up-down counter having a capacity of 256 counts. Thus, when up-down counter 112 is initialized by the initialize command on line 62, a value of 256 may be stored therein. Digital-to-analog converter 114 may thus be arranged to produce a five-volt signal in response to a count of 256 in up-down counter 112. As charge is withdrawn from the battery system, the count in up-down counter 112 and the output voltage of digital-to-analog converter 114 are correspondingly reduced.

It would be clear to one skilled in the art that the digital content of up-down counter 112 could be used directly for digital transmission of telemetry and also for feedback to controllable-gain amplifier 66 (FIG. 4) without the necessity for conversion to analog form in digital-to-analog converter 114. However, the circuit shown in FIG. 6 permits circuit simplification and conserves telemetry capacity and is therefore the preferred embodiment.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for calculating a state of charge of batteries in a battery system of the type having at least one of a variable source capacity and a variable load, comprising:
   means for measuring a charging current and a discharging current of said batteries;
   means having a first gain for accumulating a first value related to said charging current;
   means having a second gain for calculating a second value related to said discharging current;
   means for differencing said first and second values to produce a calculated state of charge of said battery system;
   means for initializing said means for differencing to a known value of said state of charge of said battery system; and
   means for selecting a value of at least one of said first and second gains effective to produce an output of said means for differencing which is an approximation of a variable state of charge of said battery system.

2. Apparatus for calculating a state of charge of a battery system according to claim 1 wherein said known value is a state of full charge.

3. Apparatus for calculating a state of charge of a battery system according to claim 1 wherein said battery system includes at least first and second batteries and said known value is a state of full charge in at least one of said first and second batteries.

4. Apparatus for calculating a state of charge of a battery system according to claim 3 wherein said known value is a state of full charge in one of said first and second batteries and a state of full discharge in the other thereof.

5. Apparatus for calculating a state of charge of a battery system according to claim 3 wherein said known value is a state of full charge in all of said at least first and second batteries.

6. Apparatus for calculating a state of charge of a battery system according to claim 1 wherein said means for selecting a value includes means for selecting one of a family of charging efficiency curves of said battery system.

7. Apparatus for calculating a state of charge of a battery system according to claim 6 further comprising means for controlling said first gain according to said charging efficiency curve and said output of said means for differencing.

8. Apparatus for calculating a state of charge of a battery system according to claim 6 wherein said means for selecting a value includes remote means for selecting a value.

9. Apparatus for calculating a state of charge of a battery system according to claim 8 wherein said remote means includes a telemetry system.

10. Apparatus for calculating a state of charge of a battery system according to claim 1 wherein said means for selecting a value includes means for selecting one of a plurality of fixed values of said first gain.

11. Apparatus for calculating a state of charge of a battery system according to claim 10 wherein said means for selecting a value includes remote means for selecting said value.

12. Apparatus for calculating a state of charge of a battery system according to claim 11 wherein said means for selecting a value includes a telemetry system.

13. Apparatus for calculating a state of charge of a battery system according to claim 1 wherein said variable load includes an interruptible load and an uninterruptible load, said apparatus further comprises a load shed relay effective for shedding said interruptible load, a threshold generator effective to generate a threshold voltage related to a condition of said battery system at which said shedding should occur, and a comparator responsive to said threshold voltage and said approximation for producing a load shed command signal, said load shed command signal being effective to actuate said load shed relay and to thereby shed said interruptible load.

14. Apparatus for calculating a state of charge of a battery system according to claim 13 wherein said battery system includes at least first and second batteries and said threshold generator is responsive to a number of said at least first and second batteries which are active in said battery system.

15. Apparatus for calculating a state of charge of a battery system according to claim 14 wherein said number of said at least first and second batteries which are active includes all of said at least first and second batteries and said known value is a full state of charge in all of said batteries.

16. Apparatus for calculating a state of charge of a battery system according to claim 14 wherein said number of said at least first and second batteries which are active includes all of said at least first and second batteries and said known value is a full state of charge in at least one of said batteries and a full state of discharge in at least another of said batteries.

17. Apparatus for calculating a state of charge of a battery system according to claim 1 wherein said means having a first gain includes means for setting said first gain to zero for charging currents less than a predetermined value, said predetermined value being dependent upon a number of said batteries being charged.

18. Apparatus for calculating a state of charge of a battery system according to claim 1 wherein said means for differencing includes a voltage-to-frequency converter responsive to said first and second values for producing a variable frequency, an up-down counter effective for counting up and down in response to said variable frequency, gating means responsive to said first value for applying said variable frequency to one of an up and a down input of said up-down counter and responsive to said second value for applying said variable frequency to the other of said up and down inputs.

19. Apparatus for calculating a state of charge of a battery system according to claim 18 wherein said means for differencing includes a digital-to-analog converter effective to convert a count in said up-down counter to a related analog voltage.

20. A method for calculating a state of charge of batteries in a battery system of the type having at least one of a variable source capacity and a variable load, comprising:

measuring a charging current and a discharging current of said batteries;

calculating a first value related to said charging current at a first gain;

calculating a second value related to said discharging current at a second gain;

differencing said first and second values to produce a calculated state of charge of said battery system;

initializing said differencing to a known value of said state of charge of said battery system; and selecting a value of at least one of said first and second gains effective to produce an output of said differencing which is an approximation of a variable state of charge of said battery system.

21. An automatic load shedding apparatus for a battery power system of the type having at least one battery and at least one of a variable source capacity and a variable load, said load including an interruptible load and an uninterruptible load, comprising:

means for producing a first signal at a first gain responsive to a charging current in said battery;

means for producing a second signal at a second gain responsive to a discharge current in said battery;

means for differencing said first and second signal to produce a state of charge signal;

means for initializing said state of charge signal to a predetermined fixed value;

means for selecting at least one of said first and second gains effective for making said state of charge signal representative of a variable state of charge of said at least one battery;

means for producing a load shed reference signal;

means for producing a load shed command signal in response to a predetermined relationship of said state of charge signal and said load shed reference signal; and a load shed relay responsive to said load shed command signal for shedding said interruptible load.

22. An automatic load shedding apparatus according to claim 21 wherein said predetermined fixed value includes a state of full charge in at least one of said at least one battery.

23. An automatic load shedding apparatus according to claim 22 wherein said at least one battery includes at least first and second batteries and said predetermined fixed value includes a full state of charge in all of said at least first and second batteries.

24. An automatic load shedding apparatus according to claim 22 wherein said at least one battery includes at least first and second batteries and said predetermined fixed value includes a full state of charge in said first battery and a state of full discharge in said second battery.

* * * * *